United States Patent
Igarashi et al.

(10) Patent No.: US 7,736,755 B2
(45) Date of Patent: Jun. 15, 2010

(54) ORGANIC ELECTROLUMINESCENT DEVICE

(75) Inventors: Tatsuya Igarashi, Kanagawa (JP); Toshihiro Ise, Kanagawa (JP); Takeshi Murakami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1087 days.

(21) Appl. No.: 11/409,063

(22) Filed: Apr. 24, 2006

(65) Prior Publication Data

US 2006/0263632 A1 Nov. 23, 2006

(30) Foreign Application Priority Data

Apr. 25, 2005 (JP) .............................. P2005-126732

(51) Int. Cl.
*H01L 51/54* (2006.01)
*C09K 11/06* (2006.01)

(52) U.S. Cl. .................. 428/690; 428/917; 313/504; 257/E51.044; 546/4

(58) Field of Classification Search .................. None
See application file for complete search history.

(56) References Cited

U.S. PATENT DOCUMENTS

| 6,783,873 | B2 * | 8/2004 | Tsuboyama et al. | 428/690 |
| 6,824,895 | B1 * | 11/2004 | Sowinski et al. | 428/690 |
| 7,029,766 | B2 * | 4/2006 | Huo et al. | 428/690 |
| 7,442,797 | B2 * | 10/2008 | Itoh et al. | 546/6 |
| 2006/0134461 | A1 * | 6/2006 | Huo et al. | 428/690 |

FOREIGN PATENT DOCUMENTS

| JP | 2002-141173 A * | 5/2002 |
| WO | WO 2004/108857 A1 | 12/2004 |
| WO | WO 2005/042444 A2 * | 5/2005 |

OTHER PUBLICATIONS

Machine translation of JP 2002-141173 (May 2002).*

* cited by examiner

*Primary Examiner*—Marie R. Yamnitzky
(74) *Attorney, Agent, or Firm*—Sughrue Mion, PLLC

(57) ABSTRACT

An organic electroluminescent device comprising: a pair of electrodes; and at least one organic compound layer including a light emitting layer between the pair of electrodes, wherein the organic compound layer contains a metal complex that has a tridentate or more ligand and two or more metal ions.

9 Claims, No Drawings

ORGANIC ELECTROLUMINESCENT DEVICE

BACKGROUND OF THE INVENTION

1. Field of the Invention

The present invention relates to an organic electroluminescent device (EL device) which can emit light by converting electric energy into optical energy.

2. Description of the Related Art

Since an organic electroluminescent device can emit high-brightness light with a low voltage, the organic electroluminescent device has attracted attentions as a promising display device. External quantum efficiency is an important characteristic of the organic electroluminescent device. The external quantum efficiency is calculated as "external quantum efficiency $\Phi$=the number of photons emitted from a device/the number of electrons injected into the device," and it can be said that it is more advantageous in view of power consumption as the external quantum efficiency becomes greater.

The external quantum efficiency of the organic electroluminescent device is defined by "external quantum efficiency $\Phi$=internal quantum efficiency×light extraction efficiency." In an organic electroluminescent device using fluorescent light emission from an organic compound, since the limit value of the internal quantum efficiency is about 25% and the light extraction efficiency is about 20%, the limit value of the external quantum efficiency is about 5%.

A technology, which can enhance the internal quantum efficiency of an organic electroluminescent by the use of a triplet light emitting material (phosphorescent material) including a platinum complex and enhance the external quantum efficiency in comparison with a conventional device (singlet light emitting device) using fluorescent light emission, is disclosed in WO 2004/108857

SUMMARY OF THE INVENTION

In the organic electroluminescent device described in WO 2004/108857, the external quantum efficiency could be improved, but improvement in durability has been required. There is requirement for further improvement in external quantum efficiency.

An object of the present invention is to provide an organic electroluminescent device having high external quantum efficiency and excellent light emission efficiency.

The above-mentioned object is accomplished by the following means.

(1) An organic electroluminescent device comprising:
a pair of electrodes; and
at least one organic compound layer including a light emitting layer between the pair of electrodes,
wherein the at least one organic compound layer contains a metal complex that has a tridentate or more ligand and two or more metal ions.

(2) The organic electroluminescent device as described in (1) above,
wherein the metal complex is a phosphorescent material.

(3) The organic electroluminescent device as described in (1) or (2) above,
wherein the tridentate or more ligand of the metal complex is a ligand in which two quadridentate ligands are connected to each other.

(4) The organic electroluminescent device as described in any of (1) to (3) above,
wherein the two or more metal ions of the metal complex are selected from the group consisting of a rhodium ion, a palladium ion, a rhenium ion, a iridium ion and a platinum ion.

(5) The organic electroluminescent device as described in any of (1) to (4) above,
wherein the metal complex is a compound represented by Formula (1)

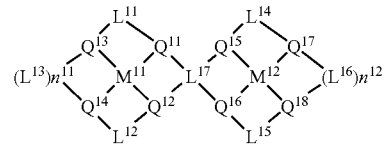

Formula (1)

wherein $M^{11}$ and $M^{12}$ each independently represents a metal ion;
$Q^{11}$, $Q^{12}$, $Q^{13}$ and $Q^{14}$ each independently represents an atom group coordinating with $M^{11}$;
$Q^{15}$, $Q^{16}$, $Q^{17}$ and $Q^{18}$ each independently represents an atom group coordinating with $M^{12}$;
$L^{11}$, $L^{12}$, $L^{13}$, $L^{14}$, $L^{15}$ and $L^{16}$ each independently represents a single bond or a connection group;
$L^{17}$ represents a connection group;
$n^{11}$ and $n^{12}$ each independently represents 0 or 1, provided that when $n^{11}$ is 0, a bond in which $L^{13}$ is interposed between $Q^{13}$ and $Q^{14}$ does not exist, and when $n^{12}$ is 0, a bond in which $L^{16}$ is interposed between $Q^{17}$ and $Q^{18}$ does not exist;
$M^{11}$-$Q^{11}$ bond, $M^{11}$-$Q^{12}$ bond, $M^{11}$-$Q^{13}$ bond, $M^{11}$-$Q^{14}$ bond, $M^{12}$-$Q^{15}$ bond, $M^{12}$-$Q^{16}$ bond, $M^{12}$-$Q^{17}$ bond and $M^{12}$-$Q^{18}$ bond each may be a covalent bond, a coordinate bond or an ion bond.

(6) The organic electroluminescent device as described in (5) above,
wherein the compound represented by Formula (1) is a compound represented by Formula (2) or (3):

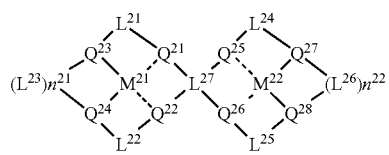

Formula (2)

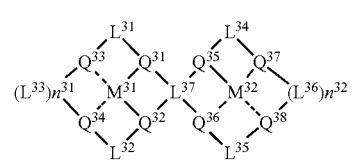

Formula (3)

In Formula (2), $M^{21}$ and $M^{22}$ each independently represents a metal ion;
$Q^{21}$, $Q^{22}$, $Q^{23}$ and $Q^{24}$ each independently represents an atom group coordinating with $M^{21}$;
$Q^{25}$, $Q^{26}$, $Q^{27}$ and $Q^{28}$ each independently represents an atom group coordinating with $M^{22}$;
$L^{21}$, $L^{22}$, $L^{23}$, $L^{24}$, $L^{25}$ and $L^{26}$ each independently represents a single bond or a connection group;
$L^{27}$ represents a connection group;

$n^{21}$ and $n^{22}$ each independently represents 0 or 1, provided that when $n^{21}$ is 0, a bond in which $L^{23}$ is interposed between $Q^{23}$ and $Q^{24}$ does not exist, and when $n^{22}$ is 0, a bond in which $L^{26}$ is interposed between $Q^{27}$ and $Q^{28}$ does not exist;

$M^{21}$-$Q^{21}$ bond, $M^{21}$-$Q^{22}$ bond, $M^{22}$-$Q^{25}$ bond and $M^{22}$-$Q^{26}$ bond (dotted line) represent coordinate bonds; and $M^{21}$-$Q^{23}$ bond, $M^{21}$-$Q^{24}$ bond, $M^{22}$-$Q^{27}$ bond and $M^{22}$-$Q^{28}$ bond each may be a covalent bond, a coordinate bond or an ion bond, and in Formula (3), $M^{31}$ and $M^{32}$ each independently represents a metal ion;

$Q^{31}$, $Q^{32}$, $Q^{33}$ and $Q^{34}$ each independently represents an atom group coordinating with $M^{31}$;

$Q^{35}$, $Q^{36}$, $Q^{37}$ and $Q^{38}$ each independently represents an atom group coordinating with $M^{32}$;

$L^{31}$, $L^{32}$, $L^{33}$, $L^{34}$, $L^{35}$ and $L^{36}$ each independently represents a single bond or a connection group;

$L^{37}$ represents a connection group;

$n^{31}$ and $n^{32}$ each independently represents 0 or 1, provided that when $n^{31}$ is 0, a bond in which $L^{33}$ is interposed between $Q^{33}$ and $Q^{34}$ does not exist, and when $n^{32}$ is 0, a bond in which $L^{36}$ is interposed between $Q^{37}$ and $Q^{38}$ does not exist;

$M^{31}$-$Q^{33}$ bond, $M^{31}$-$Q^{34}$ bond, $M^{32}$-$Q^{37}$ bond and $M^{32}$-$Q^{38}$ bond (dotted line) represent coordinate bonds; and $M^{31}$-$Q^{31}$ bond, $M^{31}$-$Q^{32}$ bond, $M^{32}$-$Q^{35}$ bond and $M^{32}$-$Q^{36}$ bond each may be a covalent bond, a coordinate bond or an ion bond.

(7) The organic electroluminescent device as described in (5) above, wherein the compound represented by Formula (1) is a compound represented by Formula (4):

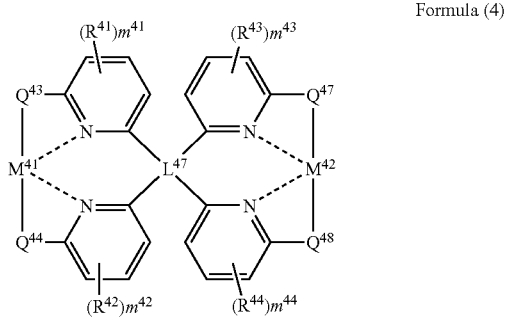

Formula (4)

wherein $M^{41}$ and $M^{42}$ each independently represents a metal ion;

$Q^{43}$ and $Q^{44}$ each independently represents an atom group coordinating with $M^{41}$;

$Q^{47}$ and $Q^{48}$ each independently represents an atom group coordinating with $M^{42}$;

$L^{47}$ represents a connection group;

$R^{41}$, $R^{42}$, $R^{43}$ and $R^{44}$ each independently represents a substituent group;

$m^{41}$, $m^{42}$, $m^{43}$ and $m^{44}$ each independently represents an integer of 0 to 3;

$M^{41}$-N bond and $M^{42}$-N bond (dotted line) represent coordinate bonds; and $M^{41}$-$Q^{43}$ bond, $M^{41}$-$Q^{44}$ bond, $M^{42}$-$Q^{47}$ bond and $M^{42}$-$Q^{48}$ bond each may be a covalent bond, a coordinate bond or an ion bond.

DETAILED DESCRIPTION OF THE INVENTION

An organic electroluminescent device according to the present invention has at least one organic compound layer including a light emitting layer between a pair of electrodes, and the organic compound layer contains a metal complex having a tridentate or more ligand and two or more metal ions.

The metal complex is preferably a phosphorescent material.

The phosphorescent quantum yield of the phosphorescent material is preferably 30% or more, more preferably 50% or more, still more preferably 70% or more, and most preferably 90% or more.

The phosphorescent quantum yield of the phosphorescent material can be measured by freezing and degassing the phosphorescent material (for examples, a concentration of $1 \times 10^3$ mol/l) dissolved in an organic solvent (such as toluene and dichloroethane) and then comparing the amount of light emission resulting from irradiation of light at a room temperature with that of a material (such as fluorescein, anthracene, and rhodamine) of which the absolute fluorescent quantum yield is known.

The life time of the phosphorescent light emitted from the phosphorescent material is preferably 10 μs or less, more preferably 5 μs or less, and most preferably 3 μs or less.

The life time of the phosphorescent light emitted from the phosphorescent material can be obtained by freezing and degassing the phosphorescent material (for examples, a concentration of $1 \times 10^{-3}$ mol/l) dissolved in an organic solvent (such as toluene and dichloroethane) and then measuring the life time of light generated by irradiation of light at a room temperature.

The metal complex has preferably two or more metal ions, and more preferably two metal ions. The metal ions includes preferably a transition metal ion, more preferably one of a ruthenium ion, a rhodium ion, a palladium ion, a silver ion, a tungsten ion, a rhenium ion, an osmium ion, an iridium ion, a platinum ion, and a gold ion, still more preferably one of a rhodium ion, a palladium ion, a rhenium ion, an iridium ion, and a platinum ion, still more preferably one of a platinum ion and a palladium ion, and most preferably a platinum ion.

The metal complex has preferably tridentate or more ligand and more preferably quadridentate or more ligand. The metal complex has preferably two or more tridentate or more ligands and more preferably a ligand in which two quadridentate ligands are connected to each other.

The ligand is not particularly limited as long as it is an atom group coordinating with the metal ions. Examples of the ligand can include an atom group coordinating with a carbon atom, an atom group coordinating with a nitrogen atom, an atom group coordinating with an oxygen atom, an atom group coordinating with a sulfur ion, and an atom group coordinating with a phosphorous ion, and the atom group coordinating with a carbon atom and the atom group coordinating with a nitrogen atom are more preferable.

Examples of the coordinate bond between the metal ion and the ligand can include a coordinate bond, a covalent bond, and an ion bond.

The metal complex may be a low-molecular compound, or may be an oligomer compound or a polymer compound having a complex in a main chain or a side chain, and is preferably the low-molecular compound. When the metal complex is the polymer compound, the weight-average molecular weight (in polystyrene equivalent) is preferably in the range of 1,000 to 5,000,000, more preferably in the range of 2,000 to 1,000,000, and still more preferably in the range of 3,000 to 100,000.

It is preferable that the metal complex is a compound represented by Formula (1).

In Formula (1), $M^{11}$ and $M^{12}$ each independently represents a metal ion. $M^{11}$ and $M^{12}$ may be the same or different from each other, and preferably $M^{11}$ and $M^{12}$ are the same. The metal ion is preferably a transition metal ion, more preferably one of a ruthenium ion, a rhodium ion, a palladium ion, a silver ion, a tungsten ion, a rhenium ion, an osmium ion, an iridium ion, a platinum ion, and a gold ion, still more preferably one of a rhodium ion, a palladium ion, a rhenium ion, an iridium ion, and a platinum ion, still more preferably one of a platinum ion and a palladium ion, and most preferably a platinum ion.

$Q^{11}$, $Q^{12}$, $Q^{13}$, and $Q^{14}$ represent atom groups (ligands) coordinating with $M^{11}$ and $Q^{15}$, $Q^{16}$, $Q^{17}$, and $Q^{18}$ represent atom groups (ligands) coordinating with $M^{12}$, respectively.

$Q^{11}$, $Q^{12}$, $Q^{13}$, and $Q^{14}$ are not particularly limited as long as they are atom groups coordinating with $M^{11}$, but are preferably one of an atom group coordinating with a carbon atom, an atom group coordinating with a nitrogen atom, an atom group coordinating with an oxygen atom, an atom group coordinating with a sulfur ion, and an atom group coordinating with a phosphorous ion, more preferably one of an atom group coordinating with a carbon atom, an atom group coordinating with a nitrogen atom, and an atom group coordinating with an oxygen atom, and still more preferably one of an atom group coordinating with a carbon atom and an atom group coordinating with a nitrogen atom.

$Q^{15}$, $Q^{16}$, $Q^{17}$, and $Q^{18}$ are not particularly limited as long as they are atom groups coordinating with $M^{12}$, but are preferably one of an atom group coordinating with a carbon atom, an atom group coordinating with a nitrogen atom, an atom group coordinating with an oxygen atom, an atom group coordinating with a sulfur ion, and an atom group coordinating with a phosphorous ion, more preferably one of an atom group coordinating with a carbon atom, an atom group coordinating with a nitrogen atom, and an atom group coordinating with an oxygen atom, and still more preferably one of an atom group coordinating with a carbon atom and an atom group coordinating with a nitrogen atom.

Examples of the atom group coordinating with a carbon atom can include an imino group, an aromatic hydrocarbon cyclic group (benzene, naphthalene, and the like), a heterocyclic group (thiophene, pyridine, pyrazine, pyrimidine, pyridazine, triazine, thiazole, oxazole, pyrrole, imidazole, pyrazole, triazole, and the like), condensed rings including the groups, and tautomers thereof. These groups may additionally have a substituent group. Examples of the substituent group can include groups to be described with reference to $R^{41}$.

Examples of the atom group coordinating with a nitrogen atom can include an nitrogen-containing heterocyclic group (pyridine, pyrazine, pyrimidine, pyridazine, triazine, thiazole, oxazole, pyrrole, imidazole, pyrazole, triazole, and the like), an amino group (alkyl amino group (which has preferably a carbon number of 2 to 30, more preferably a carbon number of 2 to 20, and most preferably a carbon number of 2 to 10, and an example of which is methyl amino), an aryl amino group (an example of which is phenyl amino), and the like), an acyl amino group (which has preferably a carbon number of 2 to 30, more preferably a carbon number of 2 to 20, and most preferably a carbon number of 2 to 10, and examples of which can include acetyl amino and benzoyl amino), an alkoxycarbonyl amino group (which has preferably a carbon number of 2 to 30, more preferably a carbon number of 2 to 20, and most preferably a carbon number of 2 to 10, and an example of which is methoxycarbonyl amino), an aryloxycarbonyl amino group (which has preferably a carbon number of 7 to 30, more preferably a carbon number of 7 to 20, and most preferably a carbon number of 7 to 12, and an example of which is phenyloxycarbonyl amino), a sulfonyl amino group (which has preferably a carbon number of 1 to 30, more preferably a carbon number of 1 to 20, and most preferably a carbon number of 1 to 12, and examples of which can include methansulfonyl amino and benzensulfonyl amino), and an amino group. These groups may be substituted again. Examples of the substituent group can include the groups to be described later with reference to $R^{41}$.

Examples of the atom group coordinating with an oxygen atom can include an alkoxy group (which has preferably a carbon number of 1 to 30, more preferably a carbon number of 1 to 20, and most preferably a carbon number of 1 to 10, and examples of which can include methoxy, ethoxy, buthoxy, and 2-ethylhexyloxy), an aryloxy group (which has preferably a carbon number of 6 to 30, more preferably a carbon number of 6 to 20, and most preferably a carbon number of 6 to 12, and examples of which can include phenyloxy, 1-naphthaloxy, and 2-naphthaloxy), and a heterocyclic oxy group (which has preferably a carbon number of 1 to 30, more preferably a carbon number of 1 to 20, and most preferably a carbon number of 1 to 12, and examples of which can include pyridyloxy, pyrazyloxy, pyrimidyloxy, and quinolyloxy), an acyloxy group (which has preferably a carbon number of 2 to 30, more preferably a carbon number of 2 to 20, and most preferably a carbon number of 2 to 10, and examples of which can include acetoxy and benzoyloxy), a silyloxy group (which has preferably a carbon number of 3 to 40, more preferably a carbon number of 3 to 30, and most preferably a carbon number of 3 to 24, and examples of which can include trimethylsilyloxy and triphenylsilyloxy), a carbonyl group (examples of which can include a ketone group, an ester group, and an amide group), an ether group (examples of which can include a dialkylether group, a diarylether group, and a furyl group). These groups may be substituted again. Examples of the substituent group can include the groups to be described later with reference to $R^{41}$.

Examples of the atom group coordinating with an sulfur atom can include an alkylthio group (which has preferably a carbon number of 1 to 30, more preferably a carbon number of 1 to 20, and most preferably a carbon number of 1 to 12, and examples of which can include methylthio and ethylthio), a arylthio group (which has preferably a carbon number of 6 to 30, more preferably a carbon number of 6 to 20, and most preferably a carbon number of 6 to 12, and examples of which can include phenylthio), a heterocyclic thio group (which has preferably a carbon number of 1 to 30, more preferably a carbon number of 1 to 20, and most preferably a carbon number of 1 to 12, and examples of which can include pyridylthio and 2-benzthiazolyl), a thiocarbonyl group (examples of which can include a thioketone group and a thioester group), and a thioether group (examples of which can include a dialkylthioether group, a diarylthioether group, and a thiofuryl group). These groups may be substituted again. Examples of the substituent group can include the groups to be described with reference to $R^{41}$ later.

Examples of the atom group coordinating with a phosphorus atom can include a dialkylphosphino group, a diarylphosphino group, trialkylphosphine, triarylphosphine, and a phosphinine group. These groups may be substituted again.

Examples of the substituent group can include the groups to be described later with reference to $R^{41}$.

$Q^{11}$, $Q^{12}$, $Q^{15}$ and $Q^{16}$ can include preferably one of an atom group coordinating with a nitrogen atom, an atom group coordinating with an oxygen atom, and an atom group coordinating with a phosphorus atom, more preferably an atom group coordinating with a nitrogen atom, still more preferably a nitrogen-containing heterocyclic group coordinating with a nitrogen atom, and most preferably a monocyclic nitrogen-containing heterocyclic group coordinating with a nitrogen atom.

$Q^{13}$, $Q^{14}$, $Q^{17}$, and $Q^{18}$ can include preferably one of an atom group coordinating with a carbon atom, an atom group coordinating with a nitrogen atom, and an atom group coordinating with an oxygen atom, more preferably one of an aryl group coordinating with a carbon atom, a heteroaryl group coordinating with a carbon atom, a heteroaryl group coordinating with a nitrogen atom, a carboxyl group coordinating with an oxygen group, an aryloxy group coordinating with an oxygen atom, and a heteroaryloxy group coordinating with an oxygen atom, still more preferably one of an aryl group coordinating with a carbon atom, a heteroaryl group coordinating with a carbon atom, a heteroaryl group coordinating with a nitrogen atom, and a carboxyl group coordinating with an oxygen atom, and most preferably one of an aryl group coordinating with a carbon atom and a heteroaryl group coordinating with a carbon atom.

$L^{11}$, $L^{12}$, $L^{13}$, $L^{14}$, $L^{15}$, and $L^{16}$ represent single bonds or connection groups. The connection groups are not particularly limited, but examples thereof can include an alkylene group (examples of which can include a methylene group, a dimethylene group, a diisopropylmethylene group, a diphenylmethylene group, an ethylene group, and a tetramethylethylene group), an alkenylene group (examples of which can include a vinylene group and a dimethylvinylene group), an alkinylene group (examples of which can include an ethinylene group), an arylene group (examples of which can include a phenylene group and a naphthalene group), a heteroarylene group (examples of which can include a pyridylene group, a pyrazylene group, and a quinolylene group), an oxygen connection group, a sulfur connection group, a nitrogen connection group (examples of which can include a methylamino connection group, a phenylamino connection group, and a t-butylamino connection group), a silicon connection group, and connection groups in which the connection groups are combined (examples of which can include an oxylenemethylene group).

$L^{11}$, $L^{12}$, $L^{14}$, and $L^{15}$ include preferably one of a single bond, an alkylene group, and an oxygen connection group, more preferably one of a signal bond and an alkylene group, and most preferably a single bond.

$L^{13}$ and $L^{16}$ include preferably one of a single bond, an alkylene group, an oxygen connection group, and a nitrogen connection group, more preferably one of an alkylene connection group and an oxygen connection group, and most preferably an alkylene connection group.

$L^{17}$ includes a four-valence or more connection group. $L^{17}$ includes preferably one of a carbon connection group, a silicon connection group, an alkenyl connection group, an aryl connection group, a heteroaryl connection group, and a connection group obtained by combining them, more preferably one of a carbon connection group and a silicon connection group, and most preferably a carbon connection group.

$n^{11}$ and $n^{12}$ represent 0 or 1. When $n^{11}$ is 0, a bond in which $L^{13}$ is interposed between $Q^{13}$ and $Q^{14}$ does not exist. When $n^{12}$ is 0, a bond in which $L^{16}$ is interposed between $Q^{17}$ and $Q^{18}$ does not exist. $n^{11}$ and $n^{12}$ are preferably 0.

The $M^{11}$-$Q^{11}$ bond, the $M^{11}$-$Q^{12}$ bond, the $N^{11}$-$Q^{13}$ bond, the $M^{11}$-$Q^{14}$ bond, the $M^{12}$-$Q^{15}$ bond, the $N^{12}$-$Q^{16}$ bond, the $M^{12}$-$Q^{17}$ bond, and the $M^{12}$-$Q^{18}$ bond may be one of a covalent bond, a coordinate bond, and an ion bond.

The $M^{11}$-$Q^{11}$ bond, the $M^{11}$-$Q^{12}$ bond, the $M^{11}$-$Q^{15}$ bond, and the $M^{11}$-$Q^{16}$ bond are preferably a coordinate bond. The $M^{11}$-$Q^{13}$ bond, the $M^{11}$-$Q^{14}$ bond, the $M^{11}$-$Q^{17}$ bond, and the $M^{11}$-$Q^{18}$ bond are preferably one of a covalent bond and an ion bond, and more preferably a covalent bond.

The compound represented by Formula (1) is preferably a compound represented by Formula (2) or (3), more preferably a compound represented by Formula (2), and most preferably a compound represented by Formula (4).

Formula (2) is now explained. $M^{21}$ and $M^{22}$ are the same as $M^{11}$ described above and the preferable ranges thereof are also the same. $M^{21}$ and $M^{22}$ may be the same or different from each other, and preferably $M^{21}$ and $M^{22}$ are the same. $Q^{21}$, $Q^{22}$, $Q^{23}$, and $Q^{24}$ represent atom groups coordinating with $M^{21}$ and $Q^{25}$, $Q^{26}$, $Q^{27}$, and $Q^{28}$ represent atom groups coordinating with $M^{22}$.

$Q^{21}$, $Q^{22}$, $Q^{25}$ and $Q^{26}$ are preferably one of an atom group coordinating with a nitrogen atom, an atom group coordinating with an oxygen atom, and an atom group coordinating with a phosphorus atom, more preferably an atom group coordinating with a nitrogen atom, still more preferably a nitrogen-containing heterocyclic group coordinating with a nitrogen atom, and most preferably a monocyclic nitrogen-containing heterocyclic group coordinating with a nitrogen atom.

$Q^{23}$, $Q^{24}$, $Q^{27}$ and $Q^{28}$ are preferably one of an atom group coordinating with a carbon atom, an atom group coordinating with a nitrogen atom, and an atom group coordinating with an oxygen atom, more preferably one of an aryl group coordinating with a carbon atom, a heteroaryl group coordinating with a carbon atom, a heteroaryl group coordinating with a nitrogen atom, a carboxyl group coordinating with an oxygen group, an aryloxy group coordinating with an oxygen atom, and a heteroaryloxy group coordinating with an oxygen atom, still more preferably one of an aryl group coordinating with a carbon atom, a heteroaryl group coordinating with a carbon atom, a heteroaryl group coordinating with a nitrogen atom, and a carboxyl group coordinating with an oxygen atom, and most preferably one of an aryl group coordinating with a carbon atom and a heteroaryl group coordinating with a carbon atom.

$L^{21}$, $L^{22}$, $L^{23}$, $L^{24}$, $L^{25}$, $L^{26}$, and $L^{27}$ are the same as $L^{11}$, $L^{12}$, $L^{13}$, $L^{14}$, $L^{15}$, $L^{16}$, and $L^{17}$ described above, and the preferable ranges thereof are also the same.

$n^{21}$ and $n^{22}$ represent 0 or 1. When $n^{21}$ is 0, a bond in which $L^{23}$ is interposed between $Q^{23}$ and $Q^{24}$ does not exist. When $n^{22}$ is 0, a bond in which $L^{26}$ is interposed between $Q^{27}$ and $Q^{28}$ does not exist. $N^{21}$ and $n^{22}$ are preferably 0.

Formula (3) is now explained. $M^{31}$ and $M^{32}$ are the same as $M^{11}$ described above and the preferable ranges thereof are also the same. $M^{31}$ and $M^{32}$ may be the same or different from each other, and preferably $M^{31}$ and $M^{32}$ are the same.

$Q^{31}$, $Q^{32}$, $Q^{33}$, and $Q^{34}$ represent atom groups coordinating with $M^{31}$ and $Q^{35}$, $Q^{36}$, $Q^{37}$, and $Q^{38}$ represent atom groups coordinating with $M^{32}$.

$Q^{31}$, $Q^{32}$, $Q^{35}$ and $Q^{36}$ are preferably one of an atom group coordinating with a carbon atom and an atom group coordinating with a nitrogen atom, more preferably one of an aryl group coordinating with a carbon atom, a heteroaryl group coordinating with a carbon atom, and a heteroaryl group coordinating with a nitrogen atom, still more preferably one of an aryl group coordinating with a carbon atom and a heteroaryl group coordinating with a carbon atom, and most preferably an aryl group coordinating with a carbon atom.

$Q^{33}$, $Q^{34}$, $Q^{37}$ and $Q^{38}$ are preferably one of an atom group coordinating with a nitrogen atom, an atom group coordinating with an oxygen atom, and an atom group coordinating with a phosphorus atom, more preferably an atom group coordinating with a nitrogen atom, still more preferably a nitrogen-containing heterocyclic group coordinating with a nitrogen atom, and most preferably a monocyclic nitrogen-containing heterocyclic group coordinating with a nitrogen atom.

$L^{31}$, $L^{32}$, $L^{33}$, $L^{34}$, $L^{35}$, $L^{36}$, and $L^{37}$ are the same as $L^{11}$, $L^{12}$, $L^{13}$, $L^{14}$, $L^{15}$, $L^{16}$, and $L^{17}$ described above, and the preferable ranges thereof are also the same.

$n^{31}$ and $n^{32}$ represent 0 or 1. When $n^{31}$ is 0, a bond in which $L^{33}$ is interposed between $Q^{33}$ and $Q^{34}$ does not exist. When $n^{32}$ is 0, a bond in which $L^{36}$ is interposed between $Q^{37}$ and $Q^{38}$ does not exist. $n^{31}$ and $n^{32}$ are preferably 0.

Formula (4) is now explained. $M^{41}$ and $M^{42}$ are the same as $M^{11}$ described above and the preferable ranges thereof are also the same. $M^{41}$ and $M^{42}$ may be the same or different from each other, and preferably $M^{41}$ and $M^{42}$ are the same.

$Q^{43}$, and $Q^{44}$ represent atom groups coordinating with $M^{41}$ and $Q^{47}$, and $Q^{48}$ represent atom groups coordinating with $M^{42}$. $Q^{43}$, $Q^{44}$, $Q^{47}$ and $Q^{48}$ are preferably one of an atom group coordinating with a carbon atom and an atom group coordinating with a nitrogen atom, more preferably one of an aryl group coordinating with a carbon atom, a heteroaryl group coordinating with a carbon atom, and a heteroaryl group coordinating with a nitrogen atom, still more preferably one of an aryl group coordinating with a carbon atom and a heteroaryl group coordinating with a carbon atom, and most preferably an aryl group coordinating with a carbon atom.

$L^{47}$ is the same as $L^{17}$ described above, and the preferable range thereof is also the same.

$R^{41}$, $R^{42}$, $R^{43}$, and $R^{44}$ represent substituent groups. Examples of the substituent groups can include an alkyl group (which has preferably a carbon number of 1 to 30, more preferably a carbon number of 1 to 20, and most preferably a carbon number of 1 to 10, and examples of which can include methyl, ethyl, iso-propyl, tert-butyl, n-octyl, n-decyl, n-hexadecyl, cyclopropyl, cyclopentyl, and cyclohexyl), an alkenyl group (which has preferably a carbon number of 2 to 30, more preferably a carbon number of 2 to 20, and most preferably a carbon number of 2 to 10, and examples of which can include vinyl, aryl, 2-butenyl, and 3-pentenyl), an alkinyl group (which has preferably a carbon number of 2 to 30, more preferably a carbon number of 2 to 20, and most preferably a carbon number of 2 to 10, and examples of which can include propargyl and 3-pentinyl), an aryl group (which has preferably a carbon number of 6 to 30, more preferably a carbon number of 6 to 20, and most preferably a carbon number of 6 to 12, and examples of which can include phenyl, p-methylphenyl, naphthyl, and anthranil), an amino group (which has preferably a carbon number of 0 to 30, more preferably a carbon number of 0 to 20, and most preferably a carbon number of 0 to 10, and examples of which can include amino, methyl amino, dimethyl amino, diethyl amino, dibenzyl amino, diphenyl amino, and ditolyl amino), an alkoxy group (which has preferably a carbon number of 1 to 30, more preferably a carbon number of 1 to 20, and most preferably a carbon number of 1 to 10, and examples of which can include methoxy, ethoxy, butoxy, and 2-ethylhexyloxy), an aryloxy group (which has preferably a carbon number of 6 to 30, more preferably a carbon number of 6 to 20, and most preferably a carbon number of 6 to 12, and examples of which can include phenyloxy, 1-naphtayloxy, and 2-naphthyloxy), a heterocyclic oxy group (which has preferably a carbon number of 1 to 30, more preferably a carbon number of 1 to 20, and most preferably a carbon number of 1 to 12, and examples of which can include pyridyloxy, pyrazyloxy, pyrimidyloxy, and quinolyloxy), an acyl group (which has preferably a carbon number of 1 to 30, more preferably a carbon number of 1 to 20, and most preferably a carbon number of 1 to 12, and examples of which can include acetyl, benzoyl, formyl, and pivaloyl), an alkoxycarbonyl group (which has preferably a carbon number of 2 to 30, more preferably a carbon number of 2 to 20, and most preferably a carbon number of 2 to 12, and examples of which can include methoxycarbonyl and ethoxycarbonyl), an aryloxycarbonyl group (which has preferably a carbon number of 7 to 30, more preferably a carbon number of 7 to 20, and most preferably a carbon number of 7 to 12, and examples of which can include phenyloxycarbonyl), an acyloxy group (which has preferably a carbon number of 2 to 30, more preferably a carbon number of 2 to 20, and most preferably a carbon number of 2 to 10, and examples of which can include acetoxy and benzoyloxy), an acyl amino group (which has preferably a carbon number of 2 to 30, more preferably a carbon number of 2 to 20, and most preferably a carbon number of 2 to 10, and examples of which can include acetyl amino and benzoyl amino), an alkoxycarbonyl amino group (which has preferably a carbon number of 2 to 30, more preferably a carbon number of 2 to 20, and most preferably a carbon number of 2 to 12, and examples of which can include methoxycarbonyl amino), an aryloxycarbonyl amino group (which has preferably a carbon number of 7 to 30, more preferably a carbon number of 7 to 20, and most preferably a carbon number of 7 to 12, and examples of which can include phenyloxycarbonyl amino), a sulfonyl amino group (which has preferably a carbon number of 1 to 30, more preferably a carbon number of 1 to 20, and most preferably a carbon number of 1 to 12, and examples of which can include methane sulfonyl amino and benzene sulfonyl amino), a sulfamoyl group (which has preferably a carbon number of 0 to 30, more preferably a carbon number of 0 to 20, and most preferably a carbon number of 0 to 12, and examples of which can include sulfamoyl, methylsulfamoyl, dimethylsulfamoyl, and phenylsulfamoyl), a carbamoyl group (which has preferably a carbon number of 1 to 30, more preferably a carbon number of 1 to 20, and most preferably a carbon number of 1 to 12, and examples of which can include carbamoyl, methylcarbamoyl, diethylcarbamoyl, and phenylcarbamoyl), an alkylthio group (which has preferably a carbon number of 1 to 30, more preferably a carbon number of 1 to 20, and most preferably a carbon number of 1 to 12, and examples of which can include methylthio and ethylthio), an arylthio group (which has preferably a carbon number of 6 to 30, more preferably a carbon number of 6 to 20, and most preferably a carbon number of 6 to 12, and examples of which can include phenylthio), a heterocyclic thio group (which has preferably a carbon number of 1 to 30, more preferably a carbon number of 1 to 20, and most preferably a carbon number of 1 to 12, and examples of which can include pyridylthio, 2-benzimizolylthio, 2-benzoxazolylthio, and 2-benzthiazolylthio), a sulfonyl group (which has preferably a carbon number of 1 to 30, more preferably a carbon number of 1 to 20, and most preferably a carbon number of 1 to 12, and examples of which can include mesyl and tosyl), a sulfinyl group (which has preferably a carbon number of 1 to 30, more preferably a carbon number of 1 to 20, and most preferably a carbon number of 1 to 12, and examples of which can include methane sulfinyl and benzene sulfinyl), an ureido group (which has preferably a carbon number of 1 to 30, more preferably a carbon number of 1 to 20, and most preferably a carbon number of 1 to 12, and examples of which can include ureido, methylureido, and phenylureido), an amide phosphate group (which has preferably a carbon number of 1 to 30, more preferably a carbon number of 1 to 20, and most preferably a carbon number of 1 to 12, and examples of which can include diethyl amide phosphate and phenyl amide phosphate), an hydroxy group, a mercapto group, a halogen atom (examples of which can include a fluorine atom, a chlorine atom, a bromine atom, and an iodine atom), a cyano group, a sulfo group, a carboxyl group, a nitro group, a hydroxamic group, a sulfino group, a hydrazino group, an imino group, a heterocyclic group (which has preferably a carbon number of 1 to 30 and more preferably a carbon number of 1 to 12 and which includes, for example, a nitrogen atom, an oxygen atom, and a sulfur atom as the hetero atom, examples of which can include imidazolyl, pyridyl, quinolyl, furyl, thienyl, piperidyl, morpholino, benzoxazolyl, benzimidazolyl, benzthiazolyl, carbazolyl, and azepinyl), a silyl group (which has preferably a carbon number of 3 to 40, more preferably a carbon number of 3 to 30, and most preferably a carbon number of 3 to 24, and examples of which can include trimethylsilyl and triphenylsilyl), and a silyloxy group (which has preferably a carbon number of 3 to 40, more preferably a carbon number of 3 to 30, and most preferably a carbon number of 3 to 24, and examples of which can include methylsilyloxy and triphenylsilyloxy). These substituent groups may be substituted again.

$R^{41}$, $R^{42}$, $R^{43}$, and $R^{44}$ are preferably one of an alkyl group, an alkoxy group, and a substituted amino group, more preferably one of an alkyl group and a substituted amino group, and most preferably an alkyl group.

$m^{41}$, $m^{42}$, $m^{43}$, and $m^{44}$ represent an integer of 0 to 3, preferably one of 0 and 1, and more preferably 0. When $m^{41}$, $m^{42}$, $m^{43}$, and $m^{44}$ are plural, the plural $R^{41}$, $R^{42}$, $R^{43}$, and $R^{44}$ may be equal to each other or different from each other.

Hereinafter, specific examples of the compounds represented by Formulas (1), (2), (3) and (4) are described, but the present invention is not limited to the examples.

(1-1)

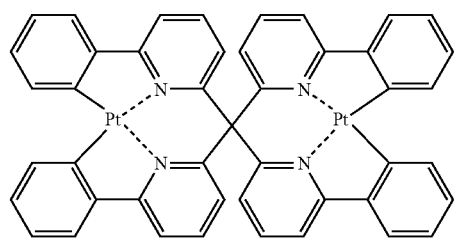

(1-2)

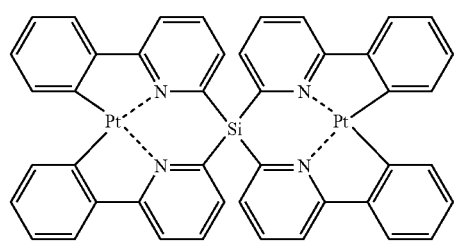

(1-3)

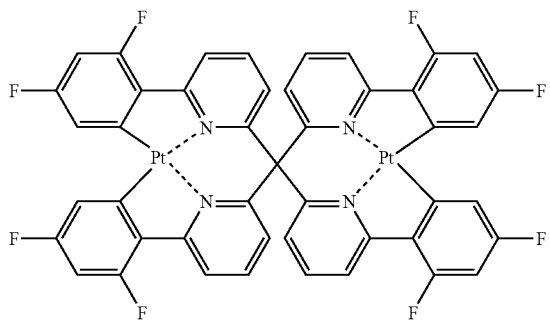

(1-4)

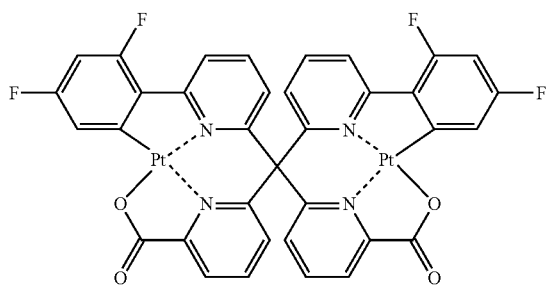

(1-5)

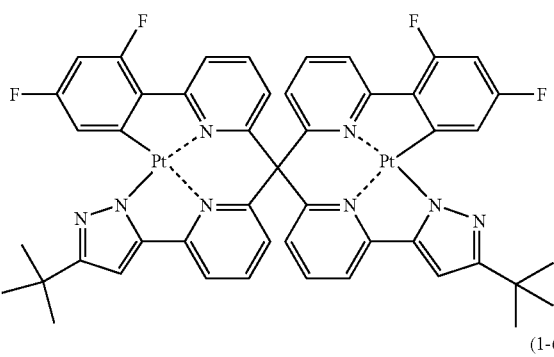

(1-6)

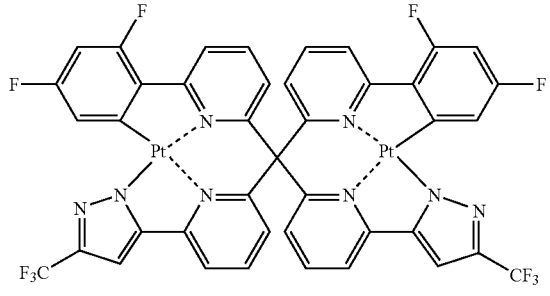

(1-7)

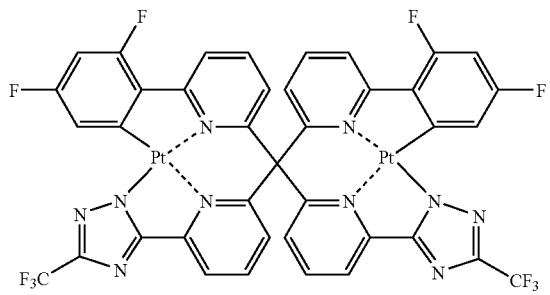

(1-8)
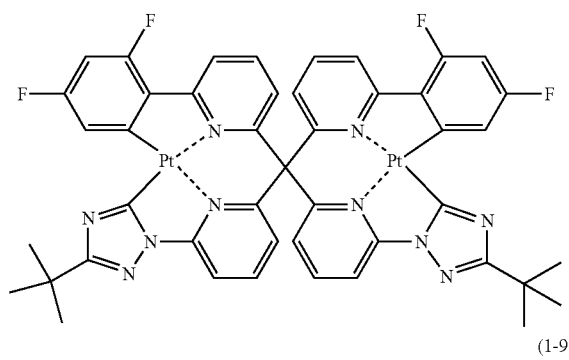
(1-9)
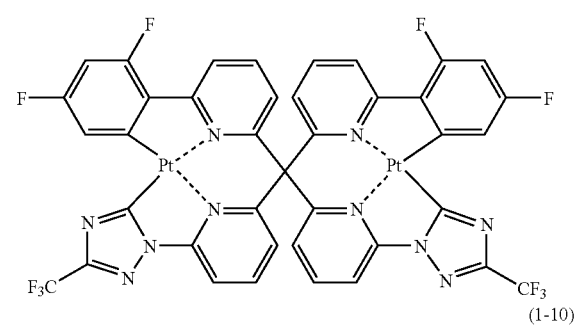
(1-10)
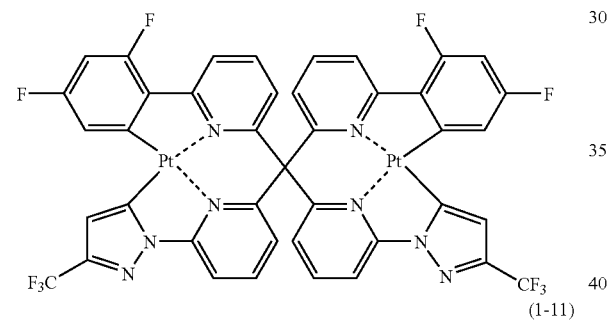
(1-11)
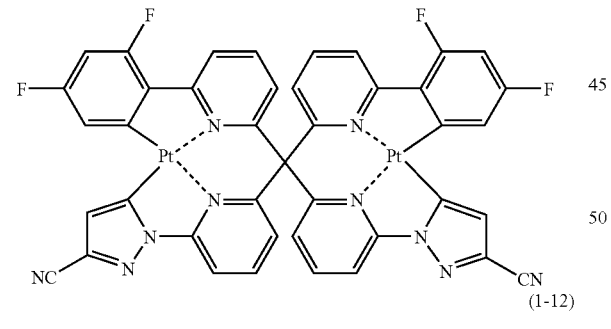
(1-12)
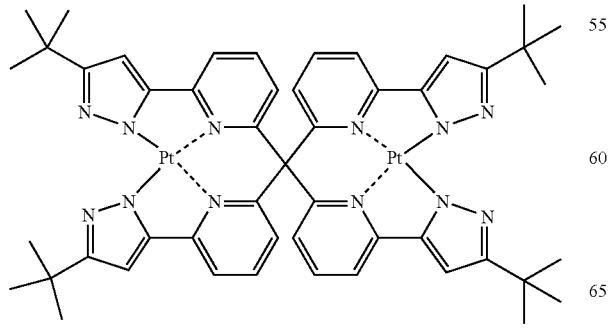
(1-13)
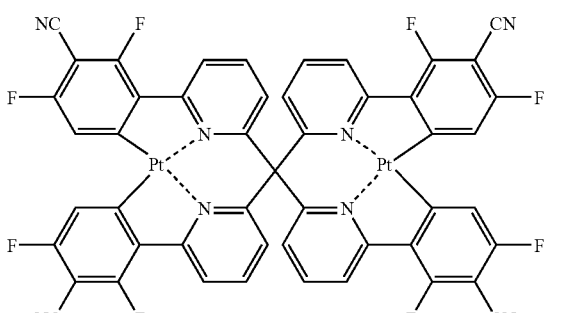
(1-14)
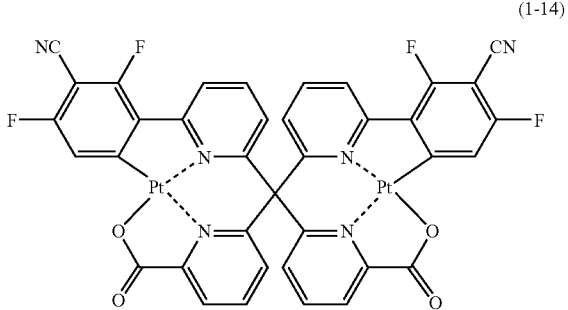
(1-15)
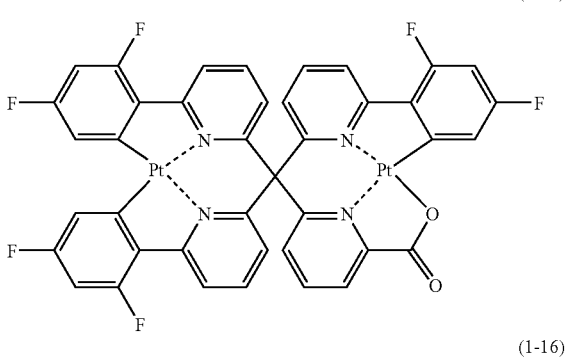
(1-16)
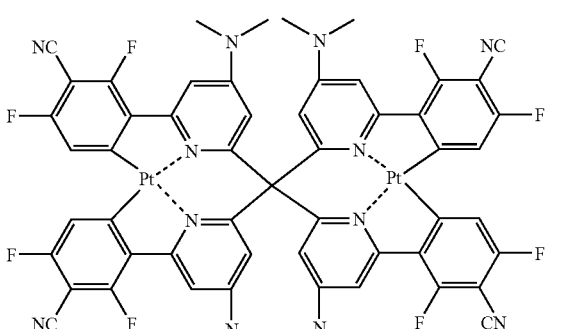
(1-17)

-continued
(1-18)
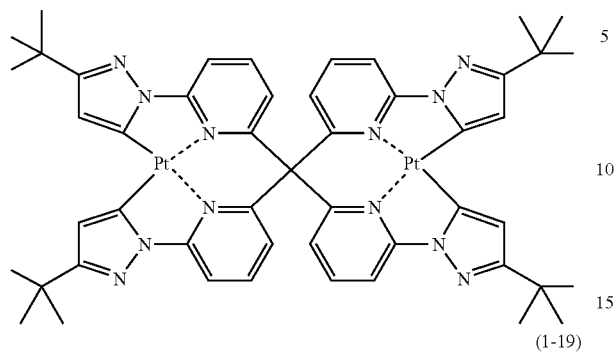
(1-19)
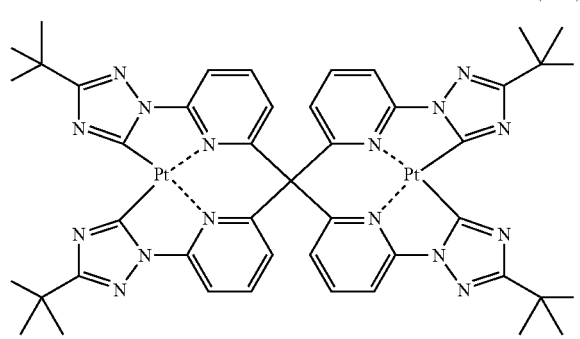
(1-20)
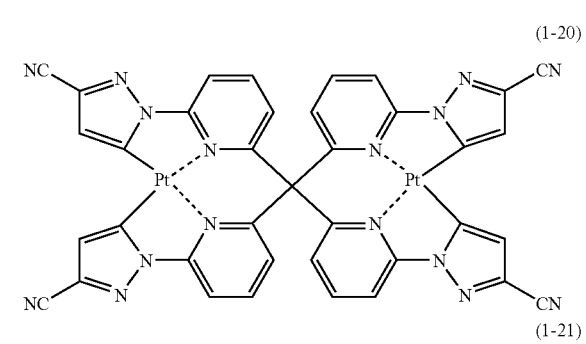
(1-21)
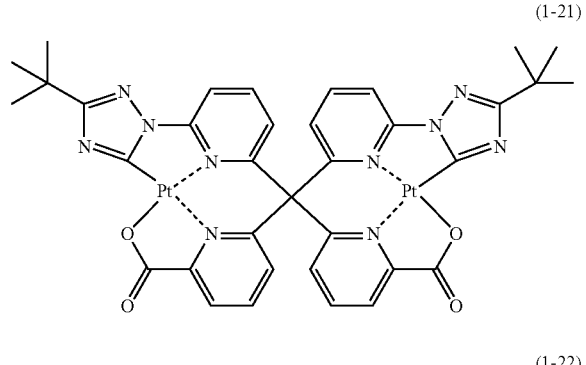
(1-22)
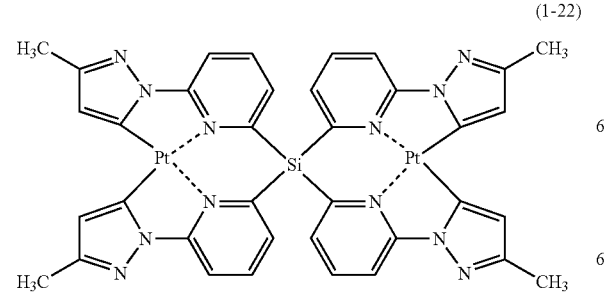
-continued
(1-23)
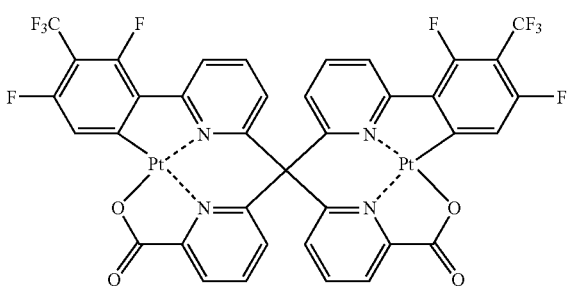
(1-24)
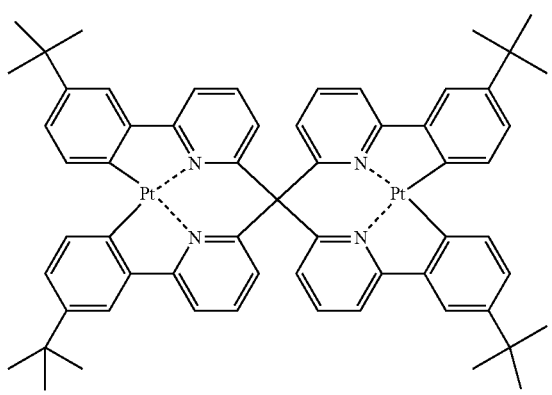
(1-25)
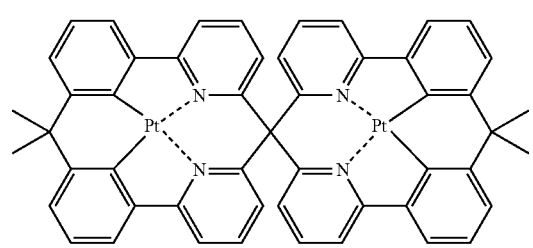
(1-26)
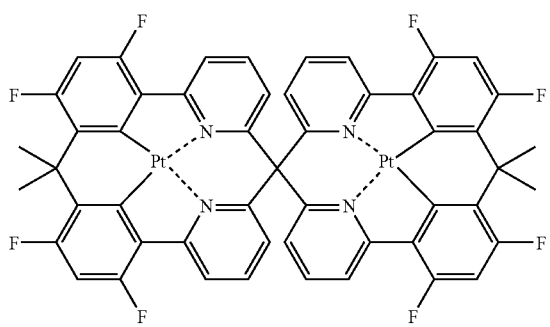
(1-27)
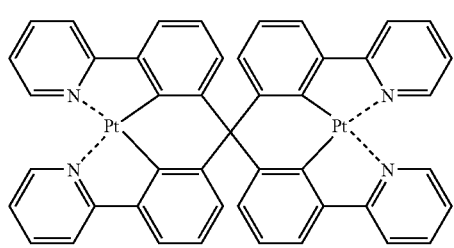

-continued
(1-28)
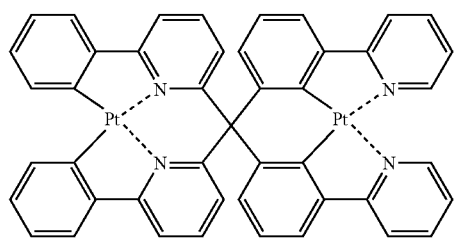
(1-29)
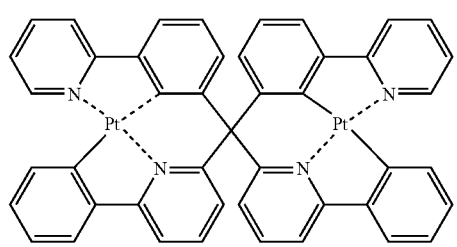
(1-30)
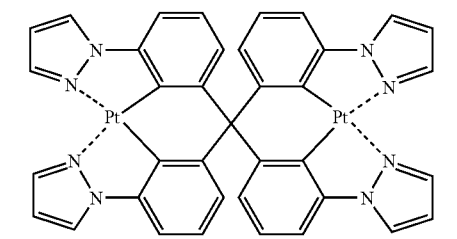
(1-31)
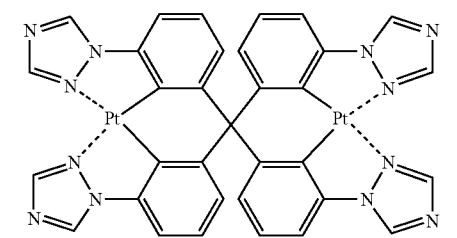
(1-32)
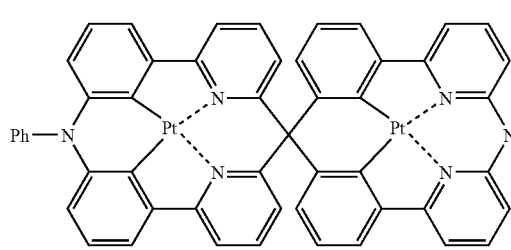
(1-33)
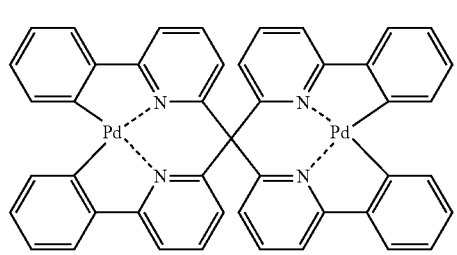
-continued
(1-34)
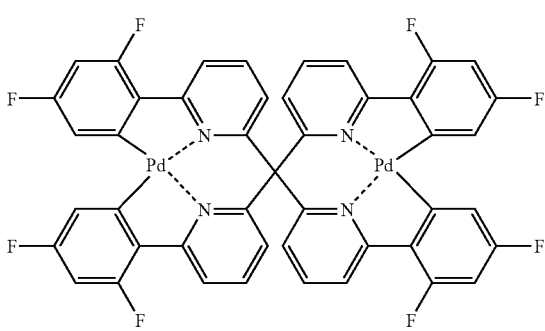
(1-35)
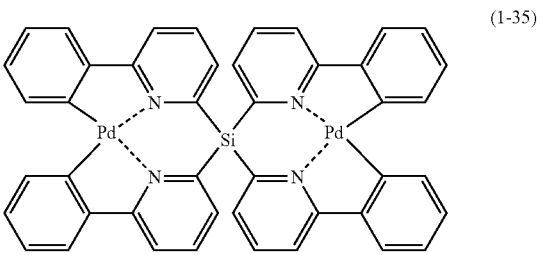
(1-36)
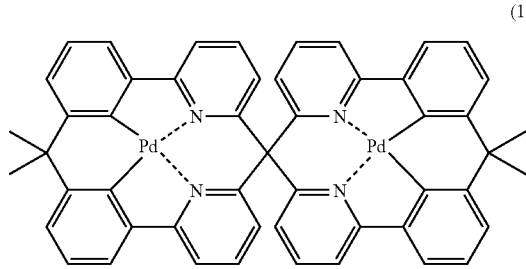
(1-37)
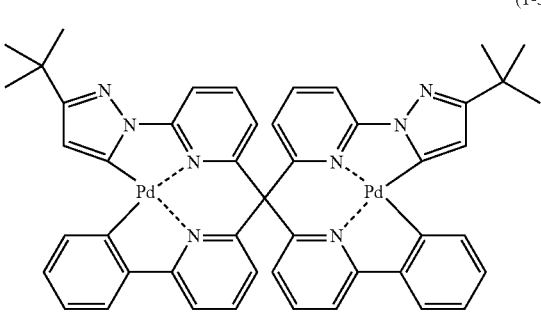
(1-38)
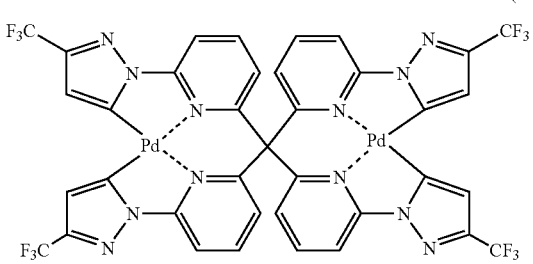

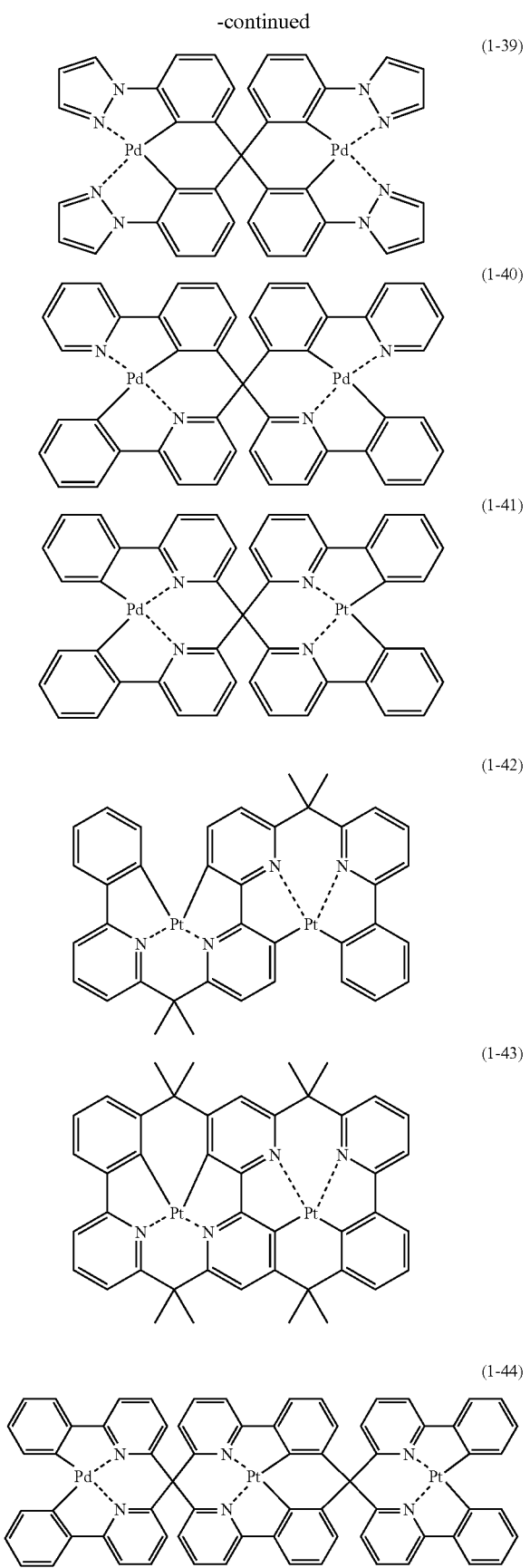
The content of the metal complex is preferably in the range of 0.1 to 99 mass % with respect to the total mass of the organic compound layer, more preferably in the range of 1 to 50 mass %, and most preferably in the range of 3 to 20 mass %. (In this specification, mass ratio is equal to weight ratio.)

In addition, the $T_1$ level (energy level of the least triplet excited state) of the layer (such as a hole transporting layer, an electron transporting layer, a charge carrier blocking layer, and an exciter blocking layer) contacting the organic compound layer containing the metal complex is preferably in the range of 60 Kcal/mol (251.4 KJ/mol) to 90 Kcal/mol (377.1 KJ/mol), more preferably in the range of 62 Kcal/mol (259.78 KJ/mol) to 85 Kcal/mol (356.15 KJ/mol), and most preferably in the range of 65 Kcal/mol (272.35 KJ/mol) to 80 Kcal/mol (335.2 KJ/mol).

The metal complexes according to the present invention described above can be manufactured with reference to well-known methods. For example, Compound (1-1) described above can be synthesized by the use of the following synthesis scheme in the same way as synthesizing Compound (79) described in page 111 of WO2004/108857 A2. Compound (1-1) may also be synthesized by converting tetrakis(N-oxopyridyl)methane, which is described Tetrahedron Lett 44(2003) 2861, into tetrakis(2-bromopyridyl)methane with phosphorous oxybromide ($POBr_3$), coupling tetrakis(2-bromopyridyl)methane to phenylboric acid to adjust tetrakis(2-phenylpyridyl)methane (ligand), and then allowing tetrakis(2-phenylpyridyl)methane to react with platinum chloride.

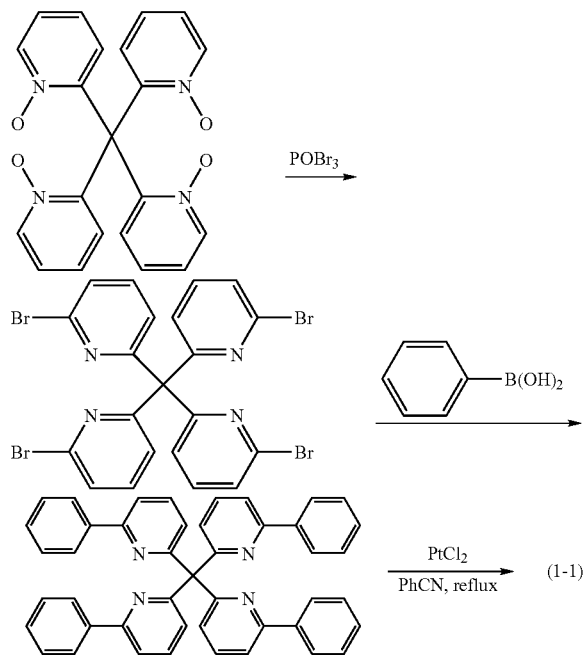

The complexes can be synthesized by mixing a ligand with a metal source (for example, platinum chloride, palladium chloride, potassium platinum chloride, sodium palladium chloride, platinum bromide, and platinum acetylacetone complex) under existence or non-existence of a solvent (for example, acetonitrile, benzonitrile, acetic acid, ethanol, methoxyethanol, glycerol, water, and a mixture solvent thereof). An additive (for example, trifluoromethane silver sulfide) for activating the reaction may be added thereto, the reaction may be performed under existence of inert gas (such as nitrogen and argon).

The reaction temperature is not particularly limited, but is preferably in the range of −30° C. to 400° C., more preferably in the range of 0° C. to 350° C., and most preferably in the range of 25° C. to 300° C.

The method of forming the organic compound layer containing the metal complex is not particularly limited, and examples thereof can include a resistance heating deposition method, an electron beam method, a sputtering method, a molecule deposition method, a coating method (such as a spray coating method, a dip coating method, an impregnation method, a roll coating method, a gravure coating method, a reverse coating method, a roll brush method, an air knife coating method, a curtain coating method, a spin coating method, a flow coating method, a bar coating method, a micro gravure coating method, an air doctor coating method, a blade coating method, a squeeze coating method, a transfer roll coating method, a kiss coating method, a cast coating method, an extrusion coating method, a wire-bar coating method, and a screen coating method), an inkjet method, a printing method, and a transfer method. Among them, the resistance heating deposition method, the coating method, and the transfer method are more preferable in view of characteristics and manufacturing thereof.

The organic electroluminescent device according to the present invention has the organic compound layer containing the metal complex as a light emitting layer between a pair of electrodes including a positive electrode and a negative electrode. The organic electroluminescent device according to the present invention may further have a functional layer in addition to the light emitting layer. Examples of the functional layer can include a hole injecting layer, a hole transporting layer, an electron injecting layer, an electron transporting layer, a protective layer, a charge carrier blocking layer, and an exciter blocking layer. The organic electroluminescent device according to the present invention preferably has at least three layers of the hole transporting layer, the light emitting layer, and the electron transporting layer. The respective layers may have different functions. A variety of well-known materials may be used to form the respective layers.

The positive electrodes serves to supply holes to the hole injecting layer, the hole transporting layer, and the light emitting layer may be made of metal, alloy, metal oxide, electrical conductive compound, or mixtures thereof. A material having a work function of 4 eV or more is preferable. Specific examples of the material can include conductive metal oxide such as tin oxide, zinc oxide, indium oxide, and indium-tin oxide (ITO), metal such as gold, silver, chromium, and nickel, a mixture or stacked material of the metal and the conductive metal oxide, an inorganic conductive material such as copper iodide and copper sulfide, an organic conductive material such as poly aniline, poly thiophene, and poly pyrrole, and a stacked material of the materials and ITO. The conductive metal oxide is preferable and ITO is more preferable in view of productivity, high conductivity, and transparency.

The thickness of the positive electrode can be properly selected depending upon the materials, but is preferably in the range of 10 nm to 5 am, more preferably in the range of 50 nm to 1 μm, and most preferably in the range of 100 nm to 500 nm.

The positive electrode is generally used in the state that it is formed on a soda lime glass substrate, an alkali-free glass substrate, a transparent resin substrate, or the like. When a glass substrate is used, the material thereof is preferably the alkali-free glass so as to reduce the ions eluted from the glass. When the soda lime glass substrate is used, it is preferable that a barrier coating process with silica is performed thereto. The thickness of the substrate is not particularly limited so long as it is enough to maintain the mechanical strength thereof, but when the glass substrate is used, the thickness of the substrate is preferably 0.2 mm or more and more preferably 0.7 mm or more.

A variety of methods can be used to manufacture the positive electrode. For example, when the positive electrode is made of ITO, the positive electrode is formed as a film by the use of an electron beam method, a sputtering method, a resistance heating deposition method, a chemical reaction method) a sol-gel method), or a method of coating a material in which indium-tin oxide is dispersed.

By performing a cleaning process or other processes to the positive electrode, the driving voltage of the device can be decreased or the light emission efficiency thereof can be increased. For example, when the positive electrode is made of ITO, UV-ozone processing or plasma processing is advantageous.

The negative electrode serves to supply electrons to the electron injecting layer, the electron transporting layer, and the light emitting layer, and the material of the negative electrode is selected in consideration of the adhesion to a layer contacting the negative electrode, such as the electron injecting layer, the electron transporting layer, and the light emitting layer, the ionization potential, and the stability. Examples of the material of the negative electrode can include metal, alloy, metal halide, metal oxide, electrical conductive compounds, and mixtures thereof. The specific examples of the material can include alkali metal (such as Li, Na, and K) and fluoride or oxide thereof, alkali earth metal (such as Mg and Ca) and fluoride or oxide thereof, gold, silver, plumbum, aluminum, sodium-potassium alloy or mixture, lithium-aluminum alloy or mixture, magnesium-silver alloy or mixture, and rare earth metal such as indium and yttrium. A material having a work function of 4 eV or less is preferable, and aluminum, lithium-aluminum alloy or mixture, and magnesium-silver alloy or mixture is more preferable. The negative electrode may have a single-layered structure of the compound and the mixture described above, or may have a multi-layered structure including the compounds and the mixtures described above. A multi-layered structure such as aluminum/lithium fluoride and aluminum/lithium oxide is preferable.

The thickness of the negative electrode can be properly selected depending upon the materials, but is preferably in the range of 10 nm to 5 µm, more preferably in the range of 50 nm to 1 µm, and most preferably in the range of 100 nm to 1 µm.

The electron beam method, the sputtering method, the resistance heating deposition method, the coating method, the transfer method, or the like can be used to manufacture the negative electrode. Two or more metals can be simultaneously deposited as simplexes. In addition, an alloy electrode may be formed by simultaneously depositing a plurality of metals and an alloy adjusted in advance may be deposited.

The sheet resistances of the positive electrode and the negative electrode are preferably low and more preferably several hundreds or less Ω/□.

Similarly to the positive electrode, the negative electrode can be prepared on a substrate. The material of the substrate is not particularly limited, and examples thereof can include an inorganic material such as zirconia-stabilized yttrium and glass, poly ester such as poly ethyleneterephthalate, poly butylenes terephthalate, and poly ethylene naphthalate, a high-molecular material such as poly ethylene, poly carbonate, poly ethersulfone, poly arylate, aryldiglycolcarbonate, poly imide, poly cycloolefin, norbornene resin, poly(chlorotrifluoro ethylene), teflon, and poly tetrafluoro ethylene-poly ethylene copolymer.

The light emitting layer may contain the metal complexes described above as the light emitting material.

The light emitting layer may contain a host material in addition to the metal complex described above. The host material is not particularly limited so long as it has a function of injecting holes from the positive electrode, the hole injecting layer, or the hole transporting layer at the time of application of a voltage and injecting electrons from the negative electrode, the electron injecting layer, or the electron transporting layer, a function of moving the injected charge carriers, or a function of providing a place for re-coupling the holes and the electrons to emit light.

Specific examples of the host material can include a variety of metal complexes such as a rare earth complex or a metal complex of benzooxazole, benzoimidazole, benzothiazole, styrylbenzene, polyphenyl, diphenyl butadiene, tetraphenyl butadiene, naphthalimide, coumarin, perylene, perignon, oxadiazole, aldazine, pyrazine, cyclopentadiene, bisstyrylanthracene, quinacridone, pyrrolopyridine, thiadiazoropyridine, styrylamine, aromatic dimethylidine compound, and 8-quinolinol, polymer compounds such as poly thiophene, poly phenylene, and poly phenylene vinylene, transition metal complexes such as organic silane, iridium trisphenylpyridine complex, and platinum forpyrine complex, and derivatives thereof.

When the light emitting layer contains the host material, the content of the host material is not particularly limited, but it is preferable that the host material is a major component (the content of which is largest). The host material is preferably in the range of 51 to 99.9 mass % and more preferably in the range of 70 to 99.9 mass %.

The ionization potential of the host material contained in the light emitting layer is preferably in the range of 5.8 eV to 6.3 eV, more preferably in the range of 5.95 eV to 6.25 eV, and most preferably in the range of 6.0 eV to 6.2 eV.

The electron mobility of the host material contained in the light emitting layer is preferably in the range of $1 \times 10^{-6}$ cm$^2$/Vs to $1 \times 10^{-1}$ cm$^2$/Vs, more preferably in the range of $5 \times 10^{-6}$ cm$^2$/Vs to $1 \times 10^{-2}$ cm$^2$/Vs, still more preferably in the range of $1 \times 10^{-5}$ cm$^2$/Vs to $1 \times 10^{-2}$ cm$^2$/Vs, and most preferably in the range of $5 \times 10^{-5}$ cm$^2$/Vs to $1 \times 10^{-2}$ cm$^2$/Vs.

The hole mobility of the host material contained in the light emitting layer is preferably in the range of $1 \times 10^{-6}$ cm$^2$/Vs to $1 \times 10^{-1}$ cm$^2$/Vs, more preferably in the range of $5 \times 10^{-6}$ cm$^2$/Vs to $1 \times 10^{-2}$ cm$^2$/Vs, still more preferably in the range of $1 \times 10^{-5}$ cm$^2$/Vs to $1 \times 10^{-2}$ cm$^2$/Vs, and most preferably in the range of $5 \times 10^{-5}$ cm$^2$/Vs to $1 \times 10^{-2}$ cm$^2$/Vs.

The glass transition point of the host material contained in the light emitting layer is preferably in the range of 90° C. to 400° C., more preferably in the range of 100° C. to 380° C., still more preferably in the range of 120° C. to 370° C., and most preferably in the range of 140° C. to 360° C.

The $T_1$ level (energy level of the least triplet excited state) of the host material contained in the light emitting layer is preferably in the range of 60 Kcal/mol (251.4 KJ/mol) to 90 Kcal/mol (377.1 KJ/mol), more preferably in the range of 62 Kcal/mol (259.78 KJ/mol) to 85 Kcal/mol (356.15 KJ/mol), and most preferably in the range of 65 Kcal/mol (272.35 KJ/mol) to 80 Kcal/mol (335.2 KJ/mol).

The thickness of the light emitting layer is not particularly limited, but is preferably in the range of 1 nm to 5 µm, more preferably in the range of 5 nm to 1 µm, and most preferably in the range of 10 nm to 500 nm.

The light emitting layer may have a single-layered structure or a multi-layered structure. When the light emitting layer has a multi-layered structure, the number of stacked layers is preferably in the range of 2 to 50 layers, more preferably in the range of 4 to 30 layers, and most preferably in the range of 6 to 20 layers. In this case, the respective layers may be made of a single material or may be made of a plurality of compounds.

The thicknesses of the layers constituting the multi-layered structure are not particularly limited, but are preferably in the range of 0.2 nm to 20 nm, more preferably in the range of 0.4 nm to 15 nm, still more preferably in the range of 0.5 nm to 10 nm, and most preferably in the range of 1 nm to 5 nm.

When the light emitting layer has a single-layered structure, the single layer may emit white light. When the light emitting layer has a multi-layered structure, the respective layers may emit light of different colors to emit, for example, white light.

The light emitting layer may have a multi-domain structure. For example, the light emitting layer may include a domain having a mixture of one host material and the light emitting material and a domain having a mixture of another host material and another light emitting material. The domain may have a volume of about 1 nm$^3$. The size of each domain is preferably in the range of 0.2 nm to 10 nm, more preferably in the range of 0.3 nm to 5 nm, still more preferably in the range of 0.5 nm to 3 nm, and most preferably in the range of 0.7 nm to 2 nm.

The method of forming the light emitting layer is not particularly limited, and examples thereof can include a resistance heating deposition method, an electron beam method, a sputtering method, a molecule deposition method, a coating method, an inkjet method, a printing method, an LB method, and a transfer method. Among them, the resistance heating deposition method and the coating method are preferable.

The materials of the hole injecting layer and the hole transporting layer may have any one of a function of injecting holes from the positive electrode, a function of transporting holes, and a function of blocking electrons injected from the negative electrode. Specific examples thereof can include a conductive high-molecular oligomer such as carbazole, triazole, oxazole, oxadiazole, imidazole, poly arylalkane, pyrazoline, pyrazolone, phenylenediamine, arylamine, amino-substituted chalcone, styrylanthracene, fluorenone, hydrazone, stilbene, silazane, aromatic third-degree amine compound, styryl amine compound, aromatic JIMECHIRI DIN compound, porphyrin compound, poly silane compound, poly(N-vinylcarbazole), aniline copolymer, thiophene oligomer, and poly thiophene, an organic silane, a carbon film, the compounds according to the present invention, and derivatives thereof.

The thicknesses of the hole injecting layer and the hole transporting layer are not particularly limited, but are preferably in the range of 1 nm to 5 μm, more preferably in the range of 5 nm to 1 μm, and most preferably in the range of 10 nm to 500 nm. The hole injecting layer and the hole transporting layer may have a single-layered structure including one or two kinds of the above-mentioned materials and may have a multi-layered structure including a plurality of layers with like or different compositions.

A vacuum deposition method, an LB method, a coating method using the material of the hole injecting layer and the hole transporting layer dissolved or dispersed in a solvent, an inkjet method, a printing method, or a transfer method can be used to form the hole injecting layer and the hole transporting layer. When the coating method is used, the material can be dissolved or dispersed along with a resin component. Examples of the resin component can include poly vinyl chloride, poly carbonate, poly styrene, poly methlymethacrylate, poly butylmethacrylate, poly ester, poly sulfon, poly phenyleneoxide, poly butadiene, poly(N-vinylcarbazole), hydrocarbon resin, ketone resin, phenoxy resin, poly amide, ethyl cellulose, vinyl acetate, ABS resin, poly urethane, melamine resin, unsaturated polyester resin, alkyd resin, epoxy resin, and silicon resin.

The materials of the electron injecting layer and the electron transporting layer may have any one of a function of injecting electrons from the negative electrode, a function of transporting electrons, and a function of blocking holes injected from the positive electrode. Specific examples thereof can include a variety of metal complexes such as metal complexes of aromatic tetracarbonic acid anhydride such as triazole, oxazole, oxadiazole, imidazole, fluorenone, anthraquinodimethane, anthrone, diphenyl quinone, thiopyrandioxide, carbodimide, fluorenylidene methane, distyrylpyrazine, naphthalene, and perylene, phthalocyanine, and 8-quinolinol, and metal complexes having methalphthalocyanine, benzooxazole, or benzothiazole as a ligand, an organic silane, and derivatives thereof.

The thicknesses of the electron injecting layer and the electron transporting layer are not particularly limited, but are preferably in the range of 1 nm to 5 μm, more preferably in the range of 5 nm to 1 μm, and most preferably in the range of 10 nm to 500 nm. The electron injecting layer and the electron transporting layer may have a single-layered structure including one or two kinds of the above-mentioned materials and may have a multi-layered structure including a plurality of layers with like or different compositions.

A vacuum deposition method, an LB method, a coating method using the material of the electron injecting layer and the electron transporting layer dissolved or dispersed in a solvent, an inkjet method, a printing method, or a transfer method can be used to form the electron injecting layer and the electron transporting layer. When the coating method is used, the material can be dissolved or dispersed along with a resin component. Examples of the resin component can include the materials exemplified for the hole injecting layer and the hole transporting layer.

A material of the protective layer may have a function of preventing a material of promoting device deterioration, such as moisture and oxygen, from entering the device. Specific examples thereof can include metal such as In, Sn, Pb, Au, Cu. Ag, Al, Ti, and Ni, metal oxide such as MgO, SiO, $SiO_2$, $Al_2O_3$, GeO, NiO, CaO, BaO, $Fe_2O_3$, $Y_2O_3$, and $TiO_2$, metal fluoride such as $MgF_2$, LiF, $AlF_3$, and $CaF_2$, nitride such as $SiN_x$ and $SiO_xN_y$, poly ethylene, poly propylene, poly methylmethacrylate, poly imide, poly urea, poly tetrafluoroethylene, poly chlorotrifluoroehtylene, poly dichlorodifluoroethylene, a copolymer of chlorotrifluoroethylene and dichlorodifluoroethylene, a copolymer obtained by copolymerizing tetrafluoroethylene and monomer mixture including at least one kind of co-monomer, fluorine-containing copolymer having a cyclic structure in a copolymer main chain, a water absorbing material having a water absorption rate of 1% or more, and a moisture-resistant material having a water absorption rate of 0.1% or less.

The method of forming the protective layer is not particularly limited, but examples thereof can include a vacuum deposition method, a sputtering method, a reactive spattering method, an MBE (molecular beam epitaxy) method, a cluster ion beam method, an ion plating method, a plasma polymerization method (high-frequency excited ion plating method), a plasma CVD method, a laser CVD method, a thermal CVD method, a gas source CVD method, a coating method, a printing method, and a transfer method.

The organic electroluminescent device according to the present invention may contain a blue fluorescent compound. Alternatively, a multi-color light emitting device or a fullcolor light emitting device may be manufactured by simultaneously using a blue light emitting device containing a blue fluorescent compound and the light emitting device according to the present invention.

In the organic electroluminescent device according to the present invention, the maximum wavelength of the emitted light is preferably in the range of 390 nm to 495 nm in view of blue color purity and more preferably in the range of 400 nm to 490 nm. The light emitting device according to the present invention may have the maximum wavelength of the emitted light at 500 nm or more and may be a white light emitting device.

In the organic electroluminescent device according to the present invention, the x value of CIE chromaticity of the emitted light is preferably 0.22 or less in view of the blue color purity and more preferably 0.20 or less. The y value of CIE chromaticity of the emitted light is preferably 0.25 or less, more preferably 0.20 or less, and most preferably 0.15 or less.

In the organic electroluminescent device according to the present invention, the half width of an emission spectrum is preferably 100 nm or less, more preferably is 90 nm or less, still more preferably 80 nm or less, and most preferably 70 nm or less.

In the organic electroluminescent device according to the present invention, the external quantum efficiency is preferably 5% or more, more preferably 10% or more, and most preferably 13% or more. As the value of the external quantum efficiency, the maximum value of the external quantum efficiency when the device is driven at 20° C. may be used or the value of the external quantum efficiency when the device is driven in the range of 100 to 300 cd/m$^2$ at 20° C. may be used.

In the organic electroluminescent device according to the present invention, the internal quantum efficiency is preferably 30% or more, more preferably 50% or more, and most preferably 70% or more. The internal quantum efficiency is calculated as "internal quantum efficiency=external quantum efficiency/light extraction efficiency." The light extraction efficiency of a conventional organic EL device is about 20%, but the light extraction efficiency may be set to 20% or more by devising the shape of a substrate, the shape of an electrode, the thickness of an organic layer, the thickness of an inorganic layer, the refractive index of an organic layer, the refractive index of an inorganic layer, and the like.

In the organic electroluminescent device according to the present invention, the light extraction efficiency can be improved by a variety of known devisal. For example, by processing the surface shape of a substrate (for example, forming a micro uneven pattern), or controlling the refractive indexes of the substrate, the ITO layer, and the organic layer, or controlling the thickness of the substrate, the ITO layer, and the organic layer, the light extraction efficiency can be improved, thereby enhancing the external quantum efficiency.

The organic electroluminescent device according to the present invention may be of a so-called top emission type, which extracts the light from the negative electrode (see Japanese Unexamined Patent Application Publication Nos. 2003-208109, 2003-248441, 2003-257651, and 2003-282261).

The system, the driving method, and the utilization type of the organic electroluminescent device according to the present invention are not particularly limited. A typical example of the electroluminescent device is an organic EL device.

The applications of the organic electroluminescent device according to the present invention are not particularly limited, but it may be used very suitably for the fields such as display device, display, backlight, electronic photograph, lighting light source, recording light source, exposing light source, reading light source, signboard, interior, optical communication.

EXAMPLE

Hereinafter, specific experimental examples of the present invention will be described, but the present invention is not limited to the specific experimental examples described below.

Comparative Example 1

A cleaned ITO substrate was placed into a vapor deposition apparatus and was coated with copper phthalocyanine with a thickness of 10 nm. NPD (N,N'-di-α-naphthyl-N,N'-diphenyl-benzidine) was deposited thereon with a thickness of 20 nm. Compound (79) described in WO 2004/108857 and CBP were deposited on the resultant structure at a ratio (mass ratio) of 5:95 with a thickness of 30 nm. Then, BAlq was deposited thereon with a thickness of 10 nm and Alq (tris(8-hydroxyquinoline)aluminum complex) was deposited thereon with a thickness of 40 nm. Thereafter, lithium fluoride was deposited with a thickness of 3 nm, and then aluminum was deposited thereon with a thickness of 60 nm, thereby manufacturing an EL device. As a result of applying a DC steady voltage to the EL device to emit light by the use of Source measure unit 2400 made by Toyo Corporation, the green light could be obtained.

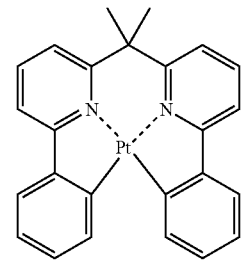

WO 2004/108857
Compound (79)

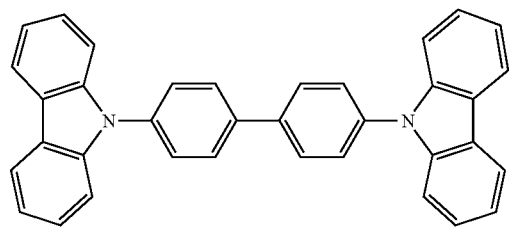

CBP

-continued

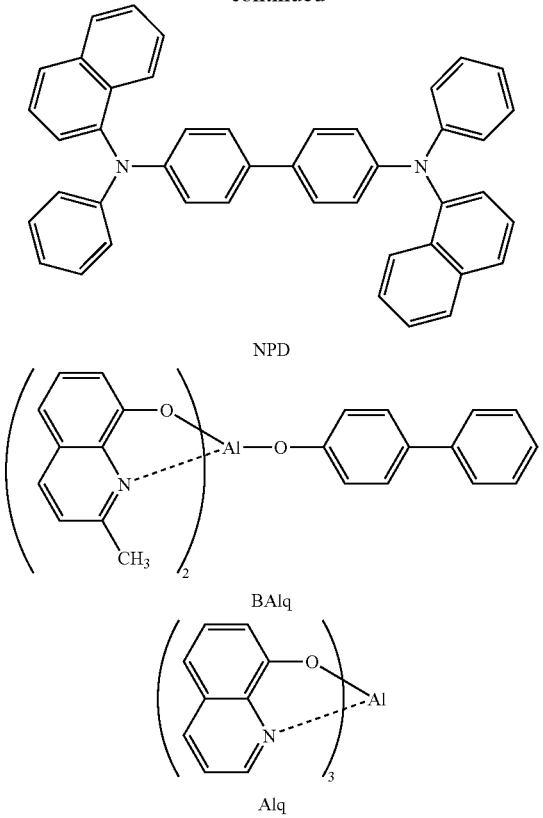

NPD

BAlq

Alq

Example 1

By using Compound (1-1) according to the present invention instead of Compound (79) in the EL device according to Comparative Example 1, an EL device was manufactured and estimated similarly to Comparative Example 1. As a result, green light could be obtained. The half-life period of brightness of the EL device when it was driven with current of 1 mA (in light emission area of 4 mm$^2$) was 2.5 times that of the EL device according to Comparative Example 1.

Example 2

By using Compound (1-3) according to the present invention instead of Compound (79) in the EL device according to Comparative Example 1, an EL device was manufactured and estimated similarly to Comparative Example 1. As a result, blue-green light could be obtained. The half-life period of brightness of the EL device when it was driven with current of 1 mA (in light emission area of 4 mm$^2$) was 2.1 times that of the EL device according to Comparative Example 1.

When the other compounds according to the present invention are used for devices, it is possible to manufacture EL devices having excellent durability.

According to the present invention described above, it is possible to provide an organic electroluminescent device having at least one of high external quantum efficiency and high durability.

The entire disclosure of each and every foreign patent application from which the benefit of foreign priority has been claimed in the present application is incorporated herein by reference, as if fully set forth.

What is claimed is:

1. An organic electroluminescent device comprising:
   a pair of electrodes; and
   at least one organic compound layer including a light emitting layer between the pair of electrodes,
   wherein the at least one organic compound layer contains a metal complex;
   wherein the metal complex is a compound represented by Formula (2) or (3):

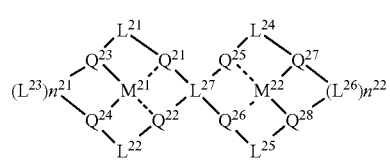

Formula (2)

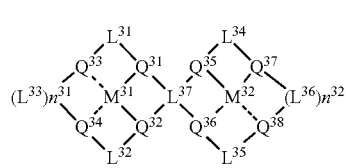

Formula (3)

in Formula (2), $M^{21}$ and $M^{22}$ each independently represents a metal ion;
$Q^{21}$, $Q^{22}$, $Q^{23}$ and $Q^{24}$ each independently represents an atom group coordinating with $M^{21}$;
$Q^{25}$, $Q^{26}$, $Q^{27}$ and $Q^{28}$ each independently represents an atom group coordinating with $M^{22}$;
$L^{21}$, $L^{22}$, $L^{23}$, $L^{24}$, $L^{25}$ and $L^{26}$ each independently represents a single bond or a connection group;
$L^{27}$ is a carbon atom, a silicon atom, an aryl group, or a heteroaryl group;
$n^{21}$ and $n^{22}$ each independently represents 0 or 1, provided that when $n^{21}$ is 0, a bond in which $L^{23}$ is interposed between $Q^{23}$ and $Q^{24}$ does not exist, and when $n^{22}$ is 0, a bond in which $L^{26}$ is interposed between $Q^{27}$ and $Q^{28}$ does not exist;
$M^{21}$-$Q^{21}$ bond, $M^{21}$-$Q^{22}$ bond, $M^{22}$-$Q^{25}$ bond and $M^{22}$-$Q^{26}$ bond (dotted line) represent coordinate bonds; and
$M^{21}$-$Q^{23}$ bond, $M^{21}$-$Q^{24}$ bond, $M^{22}$-$Q^{27}$ bond and $M^{22}$-$Q^{28}$ bond may each be a covalent bond, a coordinate bond or an ion bond, and
in Formula (3), $M^{31}$ and $M^{32}$ each independently represent a metal ion;
$Q^{31}$, $Q^{32}$, $Q^{33}$ and $Q^{34}$ each independently represents an atom group coordinating with $M^{31}$;
$Q^{35}$, $Q^{36}$, $Q^{37}$ and $Q^{38}$ each independently represents an atom group coordinating with $M^{32}$;
$L^{31}$, $L^{32}$, $L^{33}$, $L^{34}$, $L^{35}$ and $L^{36}$ each independently represents a single bond or a connection group;
$L^{37}$ is a carbon atom, a silicon atom, an aryl group, or a heteroaryl group;
$n^{31}$ and $n^{32}$ each independently represents 0 or 1, provided that when $n^{31}$ is 0, a bond in which $L^{33}$ is interposed between $Q^{33}$ and $Q^{34}$ does not exist, and when $n^{32}$ is 0, a bond in which $L^{36}$ is interposed between $Q^{37}$ and $Q^{38}$ does not exist;
$M^{31}$-$Q^{33}$ bond, $M^{31}$-$Q^{34}$ bond, $M^{32}$-$Q^{37}$ bond and $M^{32}$-$Q^{38}$ bond (dotted line) represent coordinate bonds; and $M^{31}$-$Q^{31}$ bond, $M^{31}$-$Q^{32}$ bond, $M^{32}$-$Q^{35}$ bond and $M^{32}$-$Q^{36}$ bond each may be a covalent bond, a coordinate bond or an ion bond.

2. The organic electroluminescent device according to claim 1,
wherein the metal complex is a phosphorescent material.

3. The organic electroluminescent device according to claim 1,
wherein the metal complex is a compound in which two quadridentate ligands are connected to each other.

4. The organic electroluminescent device according to claim 1,
wherein in Formula 2, $M^{21}$ and $M^{22}$, and in Formula (3), $M^{31}$ and $M^{32}$, are each independently selected from the group consisting of a rhodium ion, a palladium ion, a rhenium ion, a iridium ion and a platinum ion.

5. The organic electroluminescent device according to claim 1,
wherein in Formula (2),
$M^{21}$ and $M^{22}$ each independently represents a platinum ion;
$Q^{21}$, $Q^{22}$, $Q^{25}$ and $Q^{26}$ each independently represents a nitrogen-containing heterocyclic group coordinating with a nitrogen atom;
$Q^{23}$, $Q^{24}$, $Q^{27}$ and $Q^{28}$ each independently represents an aryl group coordinating with a carbon atom, a heteroaryl group coordinating with a carbon atom, a heteroaryl group coordinating with a nitrogen atom, or a carboxyl group coordinating with an oxygen atom;
$L^{21}$, $L^{22}$, $L^{24}$ and $L^{25}$ each independently represents a single bond; and
$L^{23}$ and $L^{26}$ each independently represents an alkylene connecting group; and
wherein in Formula (3),
$M^{31}$ and $M^{32}$ each independently represents a platinum ion;
$Q^{33}$, $Q^{34}$, $Q^{37}$ and $Q^{38}$ each independently represents a nitrogen-containing heterocyclic group coordinating with a nitrogen atom;
$Q^{31}$, $Q^{32}$, $Q^{35}$ and $Q^{36}$ each independently represents an aryl group coordinating with a carbon atom, or a heteroaryl group coordinating with a carbon atom;
$L^{31}$, $L^{32}$, $L^{34}$ and $L^{35}$ each independently represents a single bond; and
$L^{33}$ and $L^{36}$ each independently represents an alkylene connecting group.

6. The organic electroluminescent device according to claim 1, wherein in Formula (2), $L^{27}$ is a carbon atom or a silicon atom; and in Formula (3), $L^{37}$ is a carbon atom or a silicon atom.

7. The organic electroluminescent device according to claim 1, wherein in Formula (2), $n^{21}$ and $n^{22}$ each independently represents 0; and in Formula (3), $n^{31}$ and $n^{32}$ each independently represents 0.

8. An organic electroluminescent device comprising:
a pair of electrodes; and
at least one organic compound layer including a light emitting layer between the pair of electrodes,
wherein the at least one organic compound layer contains a metal complex;

wherein the metal complex is a compound represented by Formula (4):

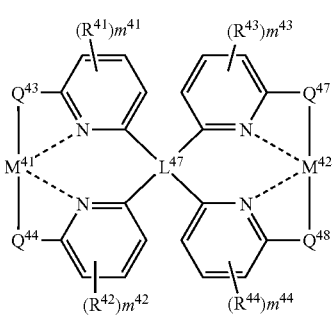

Formula (4)

wherein $M^{41}$ and $M^{42}$ each independently represents a metal ion;
$Q^{43}$ and $Q^{44}$ each independently represents an atom group coordinating with $M^{41}$;
$Q^{47}$ and $Q^{48}$ each independently represents an atom group coordinating with $M^{42}$;
$L^{47}$ is a carbon atom, a silicon atom, an aryl group, or a heteroaryl group;
$R^{41}$, $R^{42}$, $R^{43}$ and $R^{44}$ each independently represents a substituent group;
$m^{41}$, $m^{42}$, $m^{43}$ and $m^{44}$ each independently represents an integer of 0 to 3;
$M^{41}$-N bond and $M^{42}$-N bond (dotted line) represent coordinate bonds; and
$M^{41}$-$Q^{43}$ bond, $M^{41}$-$Q^{44}$ bond, $M^{42}$-$Q^{47}$ bond and $M^{42}$-$Q^{48}$ bond may each be a covalent bond, a coordinate bond or an ion bond.

9. The organic electroluminescent device according to claim 8, wherein in Formula (4);

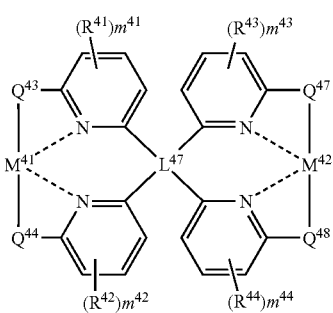

Formula (4)

$M^{41}$ and $M^{42}$ each independently represents a platinum ion;
$L^{47}$ is a carbon atom, a silicon atom, an aryl group, or a heteroaryl group;
$Q^{43}$, $Q^{44}$, $Q^{47}$ and $Q^{48}$ each independently represents an aryl group coordinating with a carbon atom, or a heteroaryl group coordinating with a carbon atom.

* * * * *